United States Patent
Wen et al.

(10) Patent No.: US 6,206,441 B1
(45) Date of Patent: Mar. 27, 2001

(54) APPARATUS AND METHOD FOR TRANSFERRING WAFERS BY ROBOT

(75) Inventors: Ming-Chien Wen, Hsin-chu; Chuan-Yuan Lu, Chi-Shun; Chi-Yun Tseng, Chu-Tung; Su-Yi Doung, Chung-Li, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/366,226

(22) Filed: Aug. 3, 1999

(51) Int. Cl.[7] ............................. B25J 15/06; B65G 49/07
(52) U.S. Cl. ............................. 296/1.1; 414/941; 901/46; 294/907
(58) Field of Search ............................. 414/744.5, 941; 294/64.1, 907, 1.1; 901/46

(56) References Cited

U.S. PATENT DOCUMENTS

| | | | |
|---|---|---|---|
| 4,720,130 | * | 1/1988 | Anbou .................................. 294/64.1 |
| 4,724,322 | * | 2/1988 | Knowles ............................... 250/341 |
| 5,622,400 | * | 4/1997 | George ................................. 294/64.1 |
| 5,980,194 | * | 11/1999 | Freerks et al. ..................... 414/941 X |
| 6,024,393 | * | 2/2000 | Shamlou ............................. 294/64.1 |
| 6,024,526 | * | 2/2000 | Slocum et al. .................. 414/226.01 |

FOREIGN PATENT DOCUMENTS 62-120991 * 6/1987 (JP) .

* cited by examiner

Primary Examiner—Steven A. Bratlie
(74) Attorney, Agent, or Firm—Tung & Associates

(57) ABSTRACT

An apparatus for transferring wafers by a robot blade and a method for using the apparatus are disclosed. In the apparatus, a robot blade that is equipped with distance sensors mounted in a bottom surface of the blade is provided which senses the distance between the bottom surface of the robot blade and an adjacent surface below the robot blade such that any possible scratching of the adjacent surface is eliminated. The adjacent surface below the robot blade may be a wafer surface in a wafer cassette, or a wafer pedestal surface in a process machine. The distance sensors are mounted in recesses in the bottom surface of the blade which may be suitably capacitance sensors, ultrasonic sensors or optical sensors. The distance sensed by the distance sensors is analyzed by a controller and compared to a predetermined value of a minimum allowable distance such that any danger of scratching the adjacent surface is eliminated.

16 Claims, 2 Drawing Sheets

APPARATUS AND METHOD FOR TRANSFERRING WAFERS BY ROBOT

FIELD OF THE INVENTION

The present invention generally relates to an apparatus and a method for transferring wafers by a robot blade and more particularly, relates to an apparatus and a method for transferring wafers by a robot blade that is equipped with distance sensors mounted in the bottom surface of the blade such that the distance between the blade and an adjacent surface below is continuously monitored to avoid scratching the surface of a wafer positioned below or colliding with a wafer pedestal.

BACKGROUND OF THE INVENTION

In the fabrication processes for semiconductor devices, a semi-conducting wafer is normally processed through many different fabrication steps, i.e., sometimes as many as several hundred. These processing steps may include deposition processes, etching processes, ion implantation processes and a variety of other processes. The fabrication equipment utilized in these processes may include process chambers that are arranged in a cluster formation with a center loadlock chamber for delivering and withdrawing wafers to and from each process chamber.

One of the key components in a loadlock chamber is a wafer blade that is normally controlled by a robotic arm. The wafer blade is also known as a robot blade. The robot blade can be constructed of a thin piece of metal such that it holds a wafer securely for delivering it into process chambers through narrow slit valves provided in the sides of the process chambers that join the loadlock chamber.

In a typical loadlock chamber, a robot blade and a storage elevator are provided. The loadlock chamber provides a wafer handling center in a clustered processing machine by isolating the plurality of process chambers from the surrounding atmosphere through the use of slit valves between the loadlock chamber and the process chambers. A cassette indexer or a SMIF pod may provide the source of wafers for the robot blade in the loadlock chamber. The loadlock chamber is normally provided with a self-contained vacuum system that maintains the interior of the chamber particle free and at a slightly higher pressure than the process chambers during wafer transfers to and from the process chambers. The self-contained vacuum system further provides the loadlock chamber with atmospheric pressure during wafer transfers to and from a cassette indexer. In a normal arrangement, up to about four process chambers can be mounted on a loadlock chamber.

A typical robot blade 10 is shown in FIG. 1. The robot blade 10 is constructed of a robot arm 12, and a wafer holder 14. The wafer holder 14 has a small thickness X such that it can go through narrow slit valves for delivering or withdrawing wafers to and from a process chamber or a cassette indexer. The robot arm 12 is constructed of a robot 18 and a mechanical arm 20. The wafer holder 14 is constructed of a blade portion 22, a pair of object sensors 24, 26 mounted in a top surface of the blade and a printed circuit board 32 for controlling the sensors 24, 26.

FIG. 1A shows a cross-sectional view of the wafer holder 14 holding a wafer 40 on top. In the configuration shown in FIG. 1A, a wafer 40 is carried on a top surface 16 of the blade 22. The object sensors 24, 26 are utilized to sense the presence of the wafer 40 which is properly positioned on the blade 22.

In utilizing the robot blade 10 shown in FIGS. 1 and 1A, the blade is used in a robot transfer system for transferring wafers between a load/unload chamber and a process chamber, for instance, during a pick/place actuation from chamber electrode/cassette. A serious processing problem arises in utilizing the robot blade, i.e., the scratching of wafer surfaces by the backside of the blade during a transfer in or out of a wafer cassette. Moreover, when a transfer has been made to a process chamber, the backside of the robot blade may scratch the top surface of a wafer pedestal and causing serious damages. In the normal configuration of a commercial robot blade, there is no provision for detecting any possible scratching or colliding of the blade with either a wafer or with a wafer pedestal. This presents a serious problem in that wafer scratching is frequently not detected such that problem persists until a large number of wafers have been scratched resulting in a great loss in throughput.

It is therefore an object of the present invention to provide an apparatus for transferring wafers by using a robot blade that does not have the drawbacks or shortcomings of the conventional robot blades.

It is another object of the present invention to provide an apparatus for transferring wafers by a robot blade that does not present the danger of scratching wafers in a wafer cassette.

It is a further object of the present invention to provide an apparatus for transferring wafers by a robot blade that does not present the danger of scratching a wafer pedestal in a process chamber.

It is another further object of the present invention to provide an apparatus for transferring wafers by a robot blade that is equipped with a distance sensor mounted in a bottom surface of the blade.

It is still another object of the present invention to provide an apparatus for transferring wafers by a robot blade that is equipped with a distance sensor mounted in such a way that a top surface of the sensor is flush with the bottom surface of the blade.

It is yet another object of the present invention to provide an apparatus for transferring wafers by a robot blade that is equipped with a capacitance sensor mounted in a bottom surface of the blade.

It is still another further object of the present invention to provide a method for transferring wafers by a robot blade by mounting a distance sensor in a bottom surface of the blade such that a minimum distance with an adjacent surface below can be maintained.

It is yet another further object of the present invention to provide a method for transferring wafers by providing a robot blade that is equipped with a capacitance sensor in a bottom surface of the blade, measuring a distance between the blade and an adjacent surface below, and stopping the blade motion when the distance measured is less than a minimum distance.

SUMMARY OF THE INVENTION

In accordance with the present invention, an apparatus and a method for transferring wafers by a robot blade equipped with distance sensors in a bottom surface of the blade are provided.

In a preferred embodiment, a robot blade for transferring wafers can be provided which includes a blade member of generally elongated shape adapted for carrying a wafer on a top surface, the blade member has at least two extended leg portions, and a total length that is larger than a diameter of the wafer it carries, at least one recess provided in a bottom surface and juxtaposed to a tip of the at least two extended leg portions, and at least one distance sensor for sensing a distance between the bottom surface of the blade member and an adjacent surface below the bottom surface mounted in the at least one recess.

In the robot blade for transferring wafers, the distance sensor may be the capacitance type, or may be a sensor selected from a capacitance sensor, an ultrasonic sensor or an optical sensor. The robot blade may further include at least one object sensor positioned in the top surface of the blade for sensing the presence or absence of an object that is carried by the blade. The robot blade may further include a blade member of generally elongated shape equipped with two extended leg portions, the leg portions may each be provided with a capacitance sensor mounted in a recess in the bottom surface of the leg portions. The robot blade may be mounted on a robot arm.

The present invention is further directed to a method for transferring wafers that can be carried out by the operating steps of first providing a wafer blade mounted on a robot arm, the blade has at least two extended leg portions for holding a wafer thereon, providing at least one distance sensor in a bottom surface of the at least two extended leg portions such that a top surface of the sensor is flush with the bottom surface of the extended leg portion, and picking up a wafer while sensing a distance between the bottom surfaces of the at least two extended leg portions and an adjacent surface below the bottom surface.

The method for transferring wafers may further include the step of stopping a motion of the wafer blade when the distance sensed is less than a pre-set minimum value. The method may further include the step of mounting at least one distance sensor selected from a capacitance sensor, an ultrasonic sensor and an optical sensor. The method may further include the step of mounting a capacitance sensor in the bottom surface of each of the at least two extended leg portions. The method may further include the step of picking up a wafer from a wafer cassette or placing a wafer onto a wafer pedestal in a process machine. The method may further include the step of sending the distance sensed by the distance sensor to a controller for comparing to a pre-stored value and determining an acceptable/unacceptable transfer condition.

In an alternate embodiment, an apparatus for transferring wafers by a robot blade can be provided which includes a robot blade of generally elongated shape adapted for carrying a wafer on a top surface. the blade has at least two extended leg portions and a total length that is larger than a diameter of the wafer it carries, at least one recess provided in a bottom surface and juxtaposed to a tip of the at least two extended leg portions, at least one distance sensor for sensing a distance between the bottom surface of the blade and an adjacent surface below the bottom surface mounted in the at least one recess, and a controller for stopping the motion of the robot blade when the distance sensed is less than a pre-set minimum value.

In the apparatus for transferring wafers by a robot blade, the at least one distance sensor may include two distance sensors with one mounted in each of two extended leg portions. The at least one distance sensor is selected from a capacitance sensor, an ultrasonic sensor or an optical sensor. The robot blade may be controlled by a robot arm. The apparatus may further include at least one object sensor positioned in the top surface of the robot blade for sensing the presence/absence of an object.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses an apparatus and a method for transferring wafers by a robot blade into and out of a loadlock chamber or a process chamber. The loadlock chamber is frequently recognized as a wafer load/unload chamber that is provided with a high vacuum environment.

The apparatus consists mainly of a robot blade that is equipped with at least one distance sensor mounted in a recess in the bottom surface of the blade such that the top surface of the distance sensor is flush with the bottom surface of the robot blade. The distance sensor utilized can be of any suitable type, such as a capacitance sensor, an ultrasonic sensor or an optical sensor. In a preferred embodiment, capacitance sensors are utilized to illustrate the present invention apparatus.

The present invention further discloses a method for transferring wafers by utilizing a novel robot blade that is equipped with distance sensors in a bottom surface of the blade. The method is carried out by picking up a wafer while sensing a distance between the bottom surface of the robot blade and an adjacent surface below the blade and stopping the motion of the robot blade when the distance sensed is less than a predetermined minimum distance. The process of determining the distance sensed by the distance sensor may be carried out by a controller which compares the distance sensed to a pre-stored value and outputting an acceptable/ unacceptable transfer condition.

In a preferred embodiment, a robot blade which has two extended leg portions is provided with two sets of capacitance sensors mounted in a bottom surface of the extended leg portions. The capacitance sensors are used to determine the distance between the bottom surface of the robot blade and a wafer positioned below when proceeding with pick/ place actuation from a chamber electrode/cassette. The present invention have apparatus effectively prevents wafer scratching caused by the backside of the robot blade touching or hitting a wafer surface during robot transferring. The apparatus therefore prevents both the robot and the chamber electrode (or the wafer pedestal) from damages during possible obstructions in the robot transfer process. The present invention apparatus further provides a process monitoring system for monitoring in real time the wafer transfer process.

Figure 1:
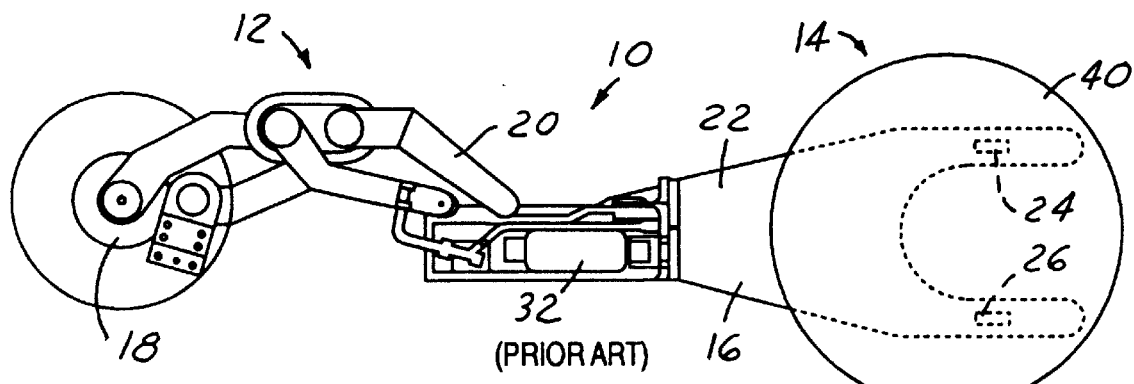
FIG. 1 is a top view of a conventional robot transfer system equipped with a robot blade.
Figure 1A:
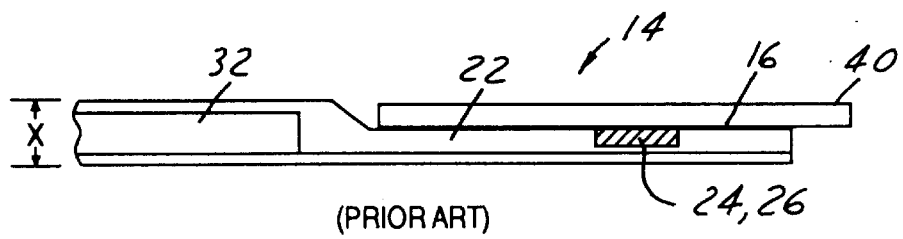
FIG. 1A is a cross-sectional view of the robot blade of FIG. 1 showing an object sensor and a wafer positioned on top of the sensor.
Figure 2:
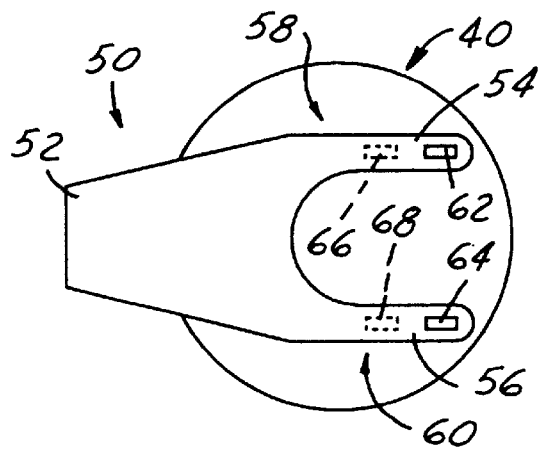
FIG. 2 is a bottom view of a present invention robot blade equipped with two distance sensors while carrying a wafer on top.
Figure 2A:
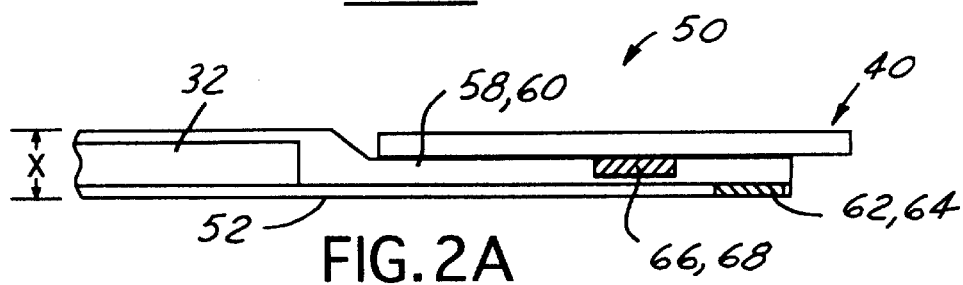
FIG. 2A is a cross-sectional view of the present invention robot blade of FIG. 2.

Referring now to FIG. 2, wherein a present invention robot blade 50 is shown. The robot blade 50 is shown in a bottom view showing a wafer 40 is being supported on top. On the bottom surface 52 of the blade 50, and at the tip portions 54, 56 of the extended leg portions 58,60, distance sensors 62 and 64 are mounted. The distance sensors 62 and 64 are mounted in recessed areas in the bottom surface 52 of the robot blade 50 such that the top surface of the sensors is flush with the bottom surface 52. This is important so that chances of scratching the wafer surface is not increased due to protruded surfaces of distance sensors from the bottom surface 52. In the top surface (not shown) of the robot blade 50, two object sensors 68 and 66 are further provided for sensing the presence or absence of a wafer positioned on top of the blade.

Figure 3A:
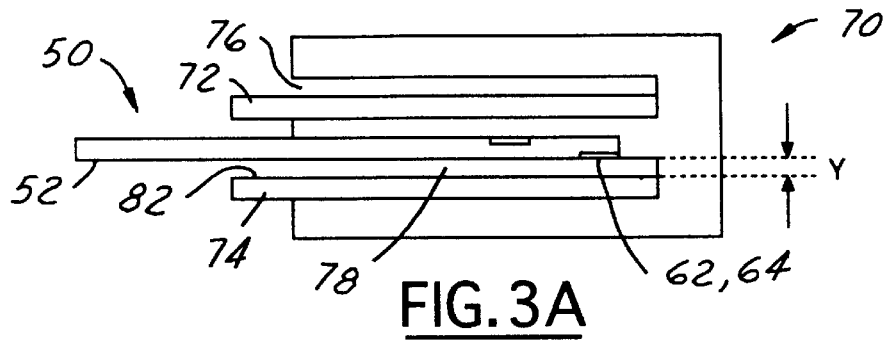
FIG. 3A is a side view of a present invention robot blade positioned in a load/unload chamber.

A first implementation example of the present invention novel robot blade 50 in a loadlock chamber is shown in FIG. 3A. It is noted that wafers 72, 74 are positioned in storage slots 76, 78 respectively. As shown in FIG. 3A, wafer 74 is a processed wafer, while wafer 72 is one for loading or unloading by the wafer blade 50. By utilizing the present invention novel robot blade 50 equipped with the distance sensors 62 and 64, a minimum distance Y is maintained between the bottom surface 52 of the blade and the top surface 82 of the wafer 74 such that any possible scratching of the top surface 82 is eliminated.

Figure 3B:
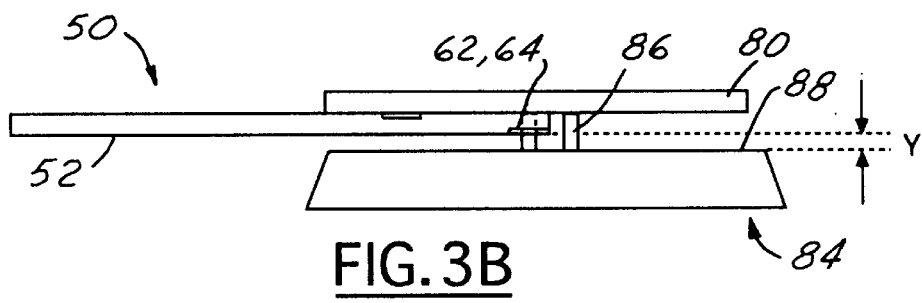
FIG. 3B is a side view of the present invention robot blade positioned in a process chamber over a wafer pedestal.

A second implementation example of the present invention novel robot blade 50 in a process chamber is shown in FIG. 3B. In this implementation example, a wafer 80 is being loaded or unloaded onto a wafer pedestal 84 (or electrode). Wafer lifter 86 are utilized for lifting the wafer 80 for accessing by the wafer blade 50. As shown in FIG. 3B, a minimum distance Y is maintained by utilizing the present invention novel blade 50 equipped with the distance sensors 62 and 64. The minimum distance between the bottom surface 52 of the robot blade 50 and the top surface 88 of the wafer pedestal 84 is maintained such that any possibility of scratching or damages to the pedestal surface can be eliminated.

Figure 4A:
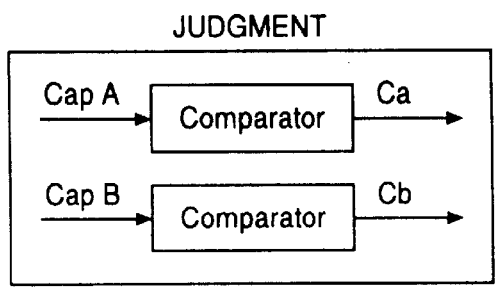
FIG. 4A is a block diagram illustrating the control circuit formed of comparators for the present invention apparatus.
Figure 4B:
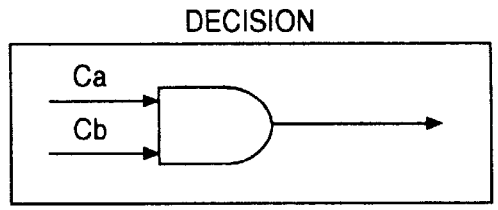
FIG. 4B is a diagram of the logic circuit for the present invention controller.
Figure 4C:
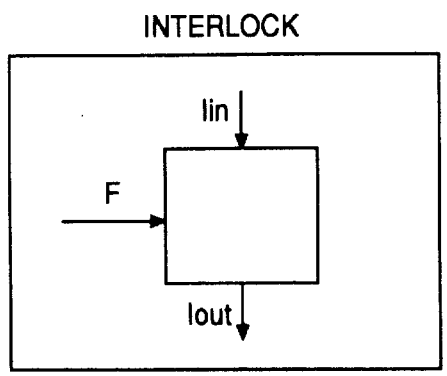
FIG. 4C is a diagram of the present invention interlock circuit.

The control functions for the present invention novel invention robot blade 50 is shown in FIGS. 4A–4C. The present invention robot blade utilizes a controller for executing three major functions of judgment, decision and interlock. At the judgment stage, two comparators are utilized when two distance sensors are mounted in the robot blade 50. This is shown in FIG. 4A. Each comparator is connected to one of the capacitance sensors' output. For instance, Cap A is the output from the capacitance sensor 62 while Cap B is the output from the capacitance sensor 66. The sensors determine the distance between the bottom surface 52 of the robot blade 50 and the top surface 82 of the wafer 74 (FIG. 3A) by means of an output voltage of the affected capacitance sensors when proceeding with pick/place actuation from cassette (or chamber). A specific threshold of affected voltage can be determined in order to define the transfer condition related to the bottom surface of the robot blade and convert the appropriate voltage from an analog output to a digital "True" or "False" output as an "Acceptable" or "Unacceptable" transfer condition.

In the decision stage, as shown in FIG. 4B, the output of AND logic gate appears only "True" when both inputs are "True" at Ca and Cb.

In the last stage of the process, as shown in FIG. 4C, the interlock operation works in a manner such that a "True" input enables the robot blade motion, while a "False" input disables the robot blade motion. As shown in FIG. 4C, "I" indicates an input or output signal.

The present invention novel apparatus and a method for using the apparatus have therefore been amply described in the above descriptions and in the appended drawings of FIGS. 2–4C.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiment of the invention in which an exclusive property or privilege is claimed are defined as follows:

1. A robot blade for transferring wafers comprising:
   a blade member of generally elongated shape adapted for carrying a wafer on a top surface, said blade member having at least two extended leg portions and a total length that is larger than a diameter of the wafer it carries,
   at least one recess provided in a bottom surface juxtaposed to a tip of said at least two extended leg portions, and
   at least one distance sensor mounted in said at least one recess for sensing a distance between said bottom surface of said blade member and an adjacent surface below said bottom surface.

2. A robot blade for transferring wafers according to claim 1, wherein said distance sensor is a capacitance sensor.

3. A robot blade for transferring wafers according to claim 1, wherein said distance sensor is selected from the group consisting of a capacitance sensor, an ultrasonic sensor and an optical sensor.

4. A robot blade for transferring wafers according to claim 1 further comprising at least one object sensor positioned in said top surface of the blade for sensing the presence or absence of an object being carried by said blade.

5. A robot blade for transferring wafers according to claim 1 further comprising a blade member of generally elongated shape equipped with two extended leg portions each provided with a capacitance sensor mounted in a recess in the bottom surface of the leg portions.

6. A robot blade for transferring wafers according to claim 1, wherein said robot blade is mounted on a robot arm.

7. A method for transferring wafers comprising the steps of:
   providing a wafer blade mounted on a robot arm, said wafer blade having at least two extended leg portions for holding a wafer thereon,
   providing at least one distance sensor mounted in a bottom surface of said at least two extended leg portions such that a top surface of said at least one distance sensor is flush with said bottom surface of said at least two extended leg portions, and
   picking up a wafer while sensing a distance between said bottom surfaces of said at least two extended leg portions and an adjacent surface below said bottom surfaces.

8. A method for transferring wafers according to claim 7 further comprising the step of stopping a motion of said wafer blade when said distance sensed is less than a pre-set minimum value.

9. A method for transferring wafers according to claim 7 further comprising the step of mounting at least one distance sensor selected from the group consisting of a capacitance sensor, an ultrasonic sensor and an optical sensor.

10. A method for transferring wafers according to claim 7 further comprising the step of mounting a capacitance sensor in the bottom surface of each of said at least two extended leg portions.

11. A method for transferring wafers according to claim 7 further comprising the step of picking up a wafer from a wafer cassette or placing a wafer onto a wafer pedestal in a process machine.

12. A method for transferring wafers according to claim 7 further comprising the step of outputting said distance sensed by said distance sensor into a controller for comparing to a pre-stored value and determining an acceptable/unacceptable transfer condition.

13. An apparatus for transferring wafers by robot comprising:

a robot blade of generally elongated shape adapted for carrying a wafer on a top surface, said robot blade having at least two extended leg portions and a total length that is larger than a diameter of the wafer it carries, at least one recess provided in a bottom surface and juxtaposed to a tip of said at least two extended leg portions, at least one distance sensor mounted in said at least one recess for sensing a distance between said bottom surface of said blade and an adjacent surface below said bottom surface, at least one object sensor positioned in said top surface of the robot blade for sensing the presence/absence of said wafer, and a controller for stopping a motion of said robot blade when said distance sensed is less than a pre-set minimum value.

14. An apparatus for transferring wafers by robot according to claim 13, wherein said at least one distance sensor comprises two distance sensors with one mounted in each of two extended leg portions.

15. An apparatus for transferring wafers by robot according to claim 13, wherein said at least one distance sensor is selected from the group consisting of a capacitance sensor, an ultrasonic sensor and an optical sensor.

16. An apparatus for transferring wafers by robot according to claim 13, wherein said robot blade is controlled by a robot arm.

* * * * *